(12) United States Patent
Pagani

(10) Patent No.: US 9,966,318 B1
(45) Date of Patent: *May 8, 2018

(54) SYSTEM FOR ELECTRICAL TESTING OF THROUGH SILICON VIAS (TSVS)

(71) Applicant: STMicroelectronics S.r.l., Agrate Brianza (IT)

(72) Inventor: Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/420,319

(22) Filed: Jan. 31, 2017

(51) Int. Cl.
*H01L 23/48* (2006.01)
*H01L 29/86* (2006.01)
*G01R 31/28* (2006.01)
*H01L 21/66* (2006.01)
*H01L 29/861* (2006.01)
*H01L 21/768* (2006.01)

(52) U.S. Cl.
CPC .......... *H01L 22/34* (2013.01); *G01R 31/2834* (2013.01); *G01R 31/2853* (2013.01); *G01R 31/2884* (2013.01); *H01L 21/76898* (2013.01); *H01L 22/14* (2013.01); *H01L 23/481* (2013.01); *H01L 29/861* (2013.01)

(58) Field of Classification Search
CPC ....... H01L 22/34; H01L 22/14; H01L 23/481; H01L 29/861; G01R 31/2834; G01R 31/2853; G01R 31/2884
See application file for complete search history.

(56) References Cited

U.S. PATENT DOCUMENTS 5,175,607 A * 12/1992 Ikeda .................. H01L 21/8222
257/511
5,635,753 A * 6/1997 Hofflinger .......... H01L 27/0922
257/503
5,814,889 A 9/1998 Gaul
(Continued)

FOREIGN PATENT DOCUMENTS

WO WO-2009115449 A1 9/2009
WO WO 2011061043 A3 * 10/2011 ......... H01L 31/0682

OTHER PUBLICATIONS

Hosali, Sharath, et al: "Through-Silicon Via Fabrication, Backgrind, and Handle Wafer Technologies," Springer Science+Business Media, LLC, 2008, pp. 85-95.
(Continued)

*Primary Examiner* — Ida M Soward
(74) *Attorney, Agent, or Firm* — Crowe & Dunlevy

(57) ABSTRACT

A substrate includes first and second semiconductor layers doped with opposite conductivity type in contact with each other at a PN junction to form a junction diode. At least one through silicon via structure, formed by a conductive region surrounded laterally by an insulating layer, extends completely through the first semiconductor layer and partially through the second semiconductor layer with a back end embedded in, and in physical and electrical contact with, the second semiconductor layer. A first electrical connection is made to the first through silicon via structure and a second electrical connection is made to the first semiconductor layer. A testing current is applied to and sensed at the first and second electrical connections in order to detect a defect in the at least one through silicon via structure.

26 Claims, 5 Drawing Sheets

(56) References Cited

U.S. PATENT DOCUMENTS

| | | | |
|---|---|---|---|
| 6,495,454 B2* | 12/2002 | Livengood | H01L 21/76898 257/E21.597 |
| 6,921,961 B2* | 7/2005 | Sanchez | H01L 21/76838 257/532 |
| 7,304,356 B2* | 12/2007 | Takahashi | H01L 29/0619 257/328 |
| 7,541,203 B1 | 6/2009 | Knickerbocker | |
| 7,547,958 B2* | 6/2009 | Toyoda | H01L 23/3121 257/565 |
| 7,893,529 B2* | 2/2011 | Hsu | H01L 23/481 136/203 |
| 7,906,363 B2* | 3/2011 | Koyanagi | H01L 21/76898 257/E21.513 |
| 8,018,031 B2* | 9/2011 | Yanagida | H01L 27/0694 257/329 |
| 8,097,964 B2* | 1/2012 | West | H01L 23/481 257/698 |
| 8,159,049 B2* | 4/2012 | Hietanen | H01L 23/481 257/432 |
| 8,232,115 B2 | 7/2012 | Ding et al. | |
| 8,299,583 B2* | 10/2012 | Zhu | H01L 21/76898 257/351 |
| 8,354,327 B2* | 1/2013 | Zengxiang | H01L 21/3212 438/429 |
| 8,476,708 B2* | 7/2013 | Fukuzumi | H01L 27/0688 257/326 |
| 8,501,587 B2* | 8/2013 | Chen | H01L 21/76898 257/698 |
| 8,742,535 B2* | 6/2014 | Bachman | H01L 21/76224 257/508 |
| 9,029,988 B2* | 5/2015 | Cheng | H01L 23/481 257/276 |
| 9,111,895 B2 | 8/2015 | Pagani | |
| 9,209,305 B1* | 12/2015 | Zhang | H01L 29/41733 |
| 9,269,789 B2* | 2/2016 | Moens | H01L 29/66462 |
| 9,337,292 B1* | 5/2016 | Ali | H01L 29/45 |
| 9,543,397 B2* | 1/2017 | Kleemeier | H01L 29/41733 |
| 9,673,316 B1* | 6/2017 | Blair | H01L 29/7802 |
| 9,793,364 B2* | 10/2017 | Hamann | H01L 29/408 |
| 2005/0101054 A1 | 5/2005 | Mastromatteo et al. | |
| 2009/0065904 A1* | 3/2009 | Wang | H01L 21/76898 257/621 |
| 2010/0144118 A1* | 6/2010 | Yang | H01L 21/76898 438/459 |
| 2010/0295600 A1 | 11/2010 | Kim et al. | |
| 2010/0332177 A1 | 12/2010 | Wu et al. | |
| 2011/0080184 A1 | 4/2011 | Wu et al. | |
| 2011/0201151 A1* | 8/2011 | Gambino | G06F 17/5068 438/107 |
| 2012/0153437 A1* | 6/2012 | Chen | H01L 27/0296 257/546 |
| 2012/0248580 A1* | 10/2012 | Matsugai | H01L 22/12 257/621 |
| 2012/0256319 A1* | 10/2012 | Mitsuhashi | H01L 27/14634 257/774 |
| 2013/0015502 A1* | 1/2013 | Fox | H01L 27/1463 257/200 |
| 2013/0020662 A1* | 1/2013 | Kao | H01L 27/14632 257/431 |
| 2013/0057312 A1 | 3/2013 | Pagani | |
| 2013/0069062 A1* | 3/2013 | Bhoovaraghan | H01L 23/58 257/48 |
| 2013/0169355 A1* | 7/2013 | Chen | H01L 23/60 327/564 |
| 2013/0181349 A1* | 7/2013 | Koyama | H01L 23/481 257/741 |
| 2014/0232012 A1* | 8/2014 | Arai | H01L 23/481 257/774 |
| 2015/0102395 A1* | 4/2015 | Park | H01L 23/642 257/301 |
| 2016/0118377 A1* | 4/2016 | Moens | H01L 29/66462 257/76 |
| 2016/0218134 A1* | 7/2016 | Umebayashi | H01L 27/14632 |

OTHER PUBLICATIONS

Po-Yuan Chen, Cheng-Wen Wu, and Ding-Ming Kwai; On-Chip TSV Testing for 3D IC before Bonding Using Sense Amplification, 2009 Asian Test Symposium, ATS '09, IEEE, Nov. 23, 2009 (Nov. 23, 2009), pp. 450-455, XP031584421.

Menglin Tsai, Amy Klooz, Alexander Leonard, Jennie Appel, Paul Franzon; Through Silicon Via(TSV) Defect/Pinhole Self Test Circuit for 3D-IC; 3D System Integration, 2009. 3DIC 2009. IEEE International Conference on, IEEE, Piscataway, NJ, USA, Sep. 28, 2009 (Sep. 28, 2009), pp. 1-8, XP031557996.

* cited by examiner

SYSTEM FOR ELECTRICAL TESTING OF THROUGH SILICON VIAS (TSVS)

TECHNICAL FIELD

The present invention relates to a system and to a method for electrical testing of through silicon vias (TSVs).

BACKGROUND

FIG. 1 shows a schematic and simplified cross-sectional view of an electronic integrated circuit wafer 1 comprising: a substrate 3 made of semiconductor material, a first dielectric layer 4, a second dielectric layer 5 and a passivation dielectric layer 6. Integrated on and within the substrate 3 are electronic components (such as, for example, transistor devices 3a). Integrated within the first dielectric layer 4 are conductive contacts 4a (for example, made source/drain/gate regions) and other structures (such as transistor gates 4b) surrounded by an insulating material. Integrated within the second dielectric layer 5 are metal interconnect lines 5a and metal vias 5b on a plurality of metallization levels (M1-Mn) that are surrounded by an insulating material, wherein the interconnect lines and vias are electrically connected to the contacts 4a and other structures of the first dielectric layer 4. The passivation dielectric layer 6 includes contact pads 7 which are electrically connected to the interconnect lines and vias of the second dielectric layer 5. The top surface of the passivation dielectric layer 6 is the front face of the wafer 1. The bottom surface of the substrate 3 is the back face of the wafer 1.

It is common to utilize Through-Silicon Via or Through-Semiconductor Via (collectively "TSV") technology in the fabrication of integrated circuits. A TSV is an interconnection of conductive material that extends vertically through the integrated circuit chip so as to enable electrical connection of elements of the circuit, integrated at various levels of the structure of the integrated circuit chip, with an external face (front and/or back) of the integrated circuit. The TSV is developed vertically through the integrated circuit chip (for example, through the substrate 3 and other included layers of the wafer 1 in such a way that, at the end of the manufacturing process, the TSV is accessible from the external face of the integrated circuit chip.

FIG. 1 shows a number of examples of the use of a TSV 9. Each TSV 9 forms a conductive interconnection that extends vertically through the substrate 3 and possibly traverses (fully or partially) one or more of the layers 4, 5 and 6. In particular, by way of example, FIG. 1 shows: a TSV 9 which extends through the layer 4 and partially through the substrate 3; a TSV 9 that extends at least partially through the layer 5, through the layer 4 and partially through the substrate 3; and a TSV 9 that extends through the layers 4 and 5 and partially through the substrate 3.

For example, the TSVs 9 may be obtained as described in United States Patent Application Publication No. 2005/0101054 (incorporated by reference), or as described in "Wafer Level 3-D ICs Process Technology", by Chuan Seng Tan, Ronald J. Gutmann and L. Rafael Reif, pp. 85-95, Springer-Verlag New York Inc. (incorporated by reference).

In the overall fabrication process, the substrate 3 with electronic components and the first dielectric layer 4 are provided through appropriate fabrication processes designated by the acronym FEOL (Front End of Line). The second dielectric layer 5 and passivation dielectric layer 6, however, are provided through appropriate fabrication processes designated by the acronym BEOL (Back End of Line). The illustration in FIG. 1 is at an intermediate stage of fabrication before the wafer is diced into individual integrated circuit chips. Thus, after the BEOL, the manufacturing process may further include the wafer dicing operation.

FIG. 2 shows the wafer 1 at a subsequent stage in the manufacturing process. Here, a step of thinning the back surface of the substrate 3 (with known techniques of lapping, or "back grinding") of the wafer 1 has been performed to expose a portion of the back end 9b of each TSV 9. After completion of the thinning process, the substrate 3 has a reduced thickness in comparison to the intermediate stage of FIG. 1, for example a thickness of less than 100 μm.

In a next step of the manufacturing processes, the wafer 1 may be diced (for example, at the lines 10) so as to define a plurality of chips 12, each of which contains a respective electronic integrated circuit. Following dicing, the chips are packaged to form integrated circuit devices.

At the end of the manufacturing process, each TSV 9 will accordingly traverse through the entire thickness of the substrate 3 as shown in FIG. 2, providing for a direct electrical connection from the back side of the chip 12 to one or more of the included electronic components, the first dielectric layer 4, the second dielectric layer 5, and the contact pads 8. The use of TSV technology is particularly advantageous for providing three-dimensional packaging structures for the electronic integrated circuits (referred to in the art as "3D-packaging techniques" or 3D/2.5D integration techniques). In such structures, plural chips are stacked one on top of the other using the TSVs 9 to support electrical connections between the stacked chips as well as with the outside of the package.

In the light of the critical aspects of the production process, and given the nature of electrical interconnection performed by the TSVs 9, it would be advantageous to be able to verify proper TSV operation at a point of the manufacturing process preferably before performing dicing of the wafer 1. Such verification of proper TSV operation would include verification of the resistance of the path offered to the electric current circulating through the through TSVs and moreover the detection of possible leakages, defects and parasitic phenomena, for example, in regard to the substrate 3. Such TSV testing is, however, difficult at the stage of manufacturing shown in FIG. 1 because the back end 9b of each TSV 9 is still contained within the body of the substrate 3 and thus is not directly available to be probed.

U.S. Pat. No. 9,111,895 (incorporated by reference) teaches a TSV testing structure and methodology that can be used at the stage of manufacturing shown in FIG. 1. With reference to FIG. 3, the substrate 3 is doped with a first conductivity type dopant (for example, P type). The TSV 9 has its back end 9b embedded in the substrate 3. The TSV 9 is formed by a conductive region 16 (for example, made of a metal material such as copper) surrounded laterally by an insulating layer 18 (for example, made of an insulating material such as silicon oxide). A region 20 within the substrate 3 at the back end 9b of the TSV 9 is doped with a second conductivity type dopant (for example, N type). The metal material of the TSV conductive region 16 is in direct physical and electrical contact with the region 20 but is isolated from the P-type substrate 3 by the combination of the lateral insulating layer 18 and underlying N-type region 20. The N-type region 20 forms with P-type substrate 3 a PN semiconductor junction (i.e., a junction diode 22) having an anode terminal provided by the substrate 3 and a cathode terminal provided by the region 20. Electrical connection to the anode terminal is made through an electrical contact 24 made to the substrate 3 while electrical connection to the cathode terminal is made through an electrical contact 26 made to the conductive region 16 of the TSV 9. The electrical contacts 24 and 26 may be implemented, for example, using electrically conductive structures (contacts, lines, vias) present within the layers 4 and 5 as well as the pads 7 in the layer 6.

In use, the presence of the junction diode 22 at the back end 9b of the TSV 9, accessible through the electrical contacts 24 and 26 and their associated pads 7 in the layer 6, enables the electrical testing of the TSV 9 to be carried out. For example, in a test procedure a test current is circulated for application to the junction diode 22 and the test current (or corresponding voltage) is measured. More specifically, in one testing implementation the junction diode 22 is forward biased so as to enable the passage of the test current through the conductive region 16 of the TSV 9. It is thus possible to evaluate, using a test apparatus coupled to the associated pads 7, the resistance offered by TSV 9 under test to the passage of the test current. In particular, it is possible to measure a resistance of a differential type causing the test current to assume two distinct values and thus measure two corresponding differences of potential. The measured differences of potential can be evaluated to determine a fault of the TSV 9 under test. Chips with fauty TSVs 9 can be identified and then discarded following the thinning of the substrate 3 and subsequent dicing operations.

FIG. 4 shows a schematic and simplified view of the testing apparatus for performing a wafer-level testing of electrical characteristics. The wafer 1 is mounted to a chuck 30. A probe head 32 is arranged with a plurality of probes 34 can be actuated so as to approach the front face of the wafer 1 and cause the plurality of probes 34 to be placed into physical and electrical contact with the pads 7 of the wafer 1. The probe head 32 is mounted to a support 36 (for example, a printed circuit board). The probe head 32, probes 34 and support 36 form a device known to those skilled in the wafer test art as a probe card 38. FIG. 3 illustrates the physical and electrical contacting of the probes 34 with the pads 7 of the wafer 1. It is through the probes that the test current is applied and the potential measurements are made under the direction and control of connected Automated Test Equipment (ATE). As known in the art, ATE is configured to perform automatic procedures for testing and electrical sorting the various chips within the wafer 1 (before the corresponding dicing operation is performed) so as to select the chips that are operating properly for their subsequent packaging. This operation is known as "Electrical Wafer Sort" (EWS) or "Wafer Sort" (WS) and envisages execution of appropriate electrical tests on the electronic integrated circuits, and in this case the TSVs 9, in the various chips.

Although FIG. 3 illustrates a preferred implementation where the probes 34 make physical and electrical contact with the pads 7, it will be understood that in alternative implementations the probe 34 may alternatively make physical and electrical contact directly with the front end 9a of the TSVs 9. This can be accomplished, for example, in situations where the TSVs extend up to layer 6 (and are exposed through the layer 6) or in situations where testing is performed prior to BEOL processing and the formation of layers 5 and 6.

Details of possible testing scenarios, as well as other related TSV testing structures, are provided in U.S. Pat. No. 9,111,895 and will not be repeated here.

SUMMARY

In an embodiment, an apparatus comprises: a semiconductor substrate including a first semiconductor layer of a first conductivity type and a second semiconductor layer of a second conductivity type opposite the first conductivity type, said first and second semiconductor layers in contact with each other at a PN junction to form a junction diode; a first through silicon via structure comprising a conductive region surrounded laterally by an insulating layer, said first through silicon via structure extending completely through the first semiconductor layer and partially through the second semiconductor layer with a back end of the first through silicon via structure embedded in the second semiconductor layer with the conductive region in physical and electrical contact with second conductivity type doped semiconductor material of the second semiconductor layer; a first electrical connection made to a front end of the first through silicon via structure; and a second electrical connection made to first conductivity type doped semiconductor material of the first semiconductor layer.

In an embodiment, a method is presented for testing a wafer including a semiconductor substrate comprising a first semiconductor layer of a first conductivity type and a second semiconductor layer of a second conductivity type opposite the first conductivity type, said first and second semiconductor layers in contact with each other at a PN junction to form a junction diode, said wafer further including a first through silicon via structure comprising a conductive region surrounded laterally by an insulating layer, said first through silicon via structure extending completely through the first semiconductor layer and partially through the second semiconductor layer with a back end of the first through silicon via structure embedded in the second semiconductor layer with the conductive region in physical and electrical contact with second conductivity type doped semiconductor material of the second semiconductor layer.

The method for testing comprises: generating a testing current applied to flow through the first through silicon via structure; and sensing said testing current at the first semiconductor layer in order to detect a fault in the first through silicon via structure.

The method for testing further comprises: generating a testing current applied to flow through the first through silicon via structure; and sensing said testing current at the first semiconductor layer in order to confirm correct operation of said first through silicon via structure.

In an embodiment, a method is presented for testing a wafer including a semiconductor substrate comprising a first semiconductor layer of a first conductivity type and a second semiconductor layer of a second conductivity type opposite the first conductivity type, said first and second semiconductor layers in contact with each other at a PN junction to form a junction diode, said wafer further including a first and second through silicon via structures each comprising a conductive region surrounded laterally by an insulating layer, said first and second through silicon via structures extending completely through the first semiconductor layer and partially through the second semiconductor layer with a back end of the first and second through silicon via structures embedded in the second semiconductor layer with the conductive region in physical and electrical contact with second conductivity type doped semiconductor material of the second semiconductor layer.

The method for testing comprises: generating a testing current applied to flow through the first through silicon via structure; and sensing said testing current at the second through silicon via structure in order to confirm correct operation of said first and second through silicon via structures.

The method for testing comprises: generating a testing current applied to flow through the first through silicon via structure; and sensing an absence of said testing current at the second through silicon via structure in order to detect a fault in at least one of the first and second through silicon via structures.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION

Figure 5:
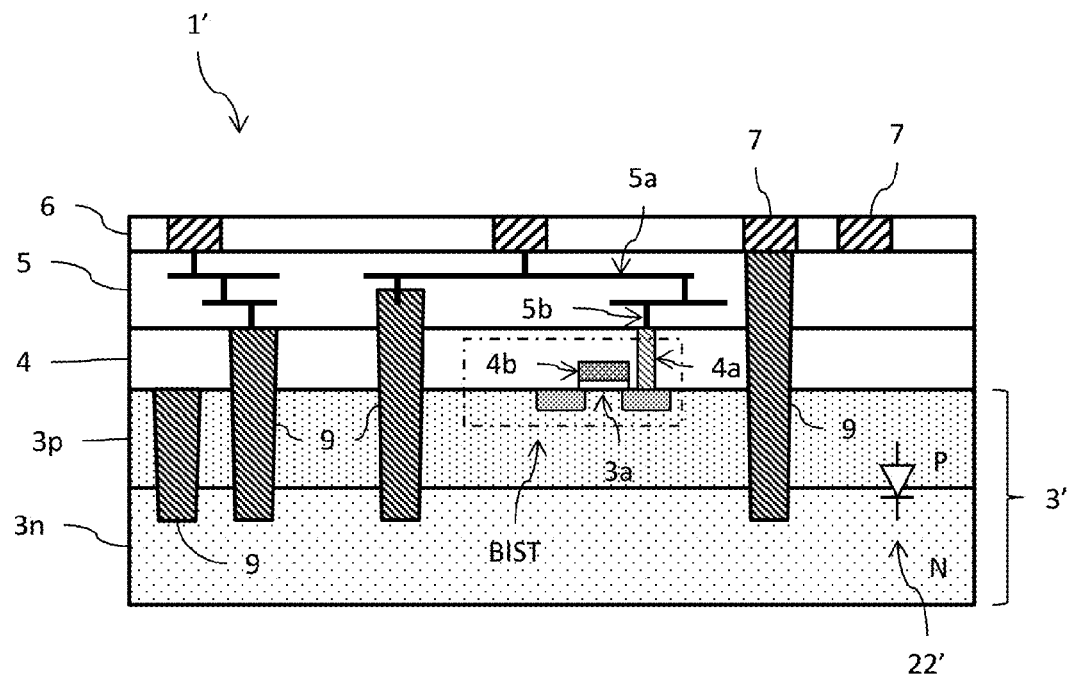
FIG. 5 is a schematic cross-section of a wafer of semiconductor material, in which through vias are provided, at an intermediate stage of a manufacturing process.

FIG. 5 shows a schematic and simplified cross-sectional view of an electronic integrated circuit wafer 1' comprising: a substrate 3' of semiconductor material, a first dielectric layer 4, a second dielectric layer 5 and a passivation dielectric layer 6. The substrate 3' comprises a first layer 3n of semiconductor material doped with a first conductivity type dopant (for example, N type) and a second layer 3p of semiconductor material doped with a second conductivity type dopant (for example, P type). The formation of a substrate 3' having opposite conductivity type doped layers 3n and 3p in contact with each other as shown may be accomplished using a number of different techniques, known to those skilled in the art, including dopant implantation with diffusion or epitaxial growth with insitu doping or subsequent implantation and diffusion. Although layers 3n and 3p are shown in the example of FIG. 5 as being doped n-type and p-type, respectively, it will be understood that the layers could alternatively be doped p-type and n-type, respectively. Still further, the layer 3p could be implemented in an embodiment as a doped well structure contained within the layer 3n.

Integrated on and within the substrate layer 3p are electronic components (such as, for example, transistor devices 3a). Integrated within the first dielectric layer 4 are contacts 4a (for example, made source/drain/gate regions) and other structures (such as transistor gates 4b) surrounded by an insulating material. Integrated within the second dielectric layer 5 are interconnect lines 5a and vias 5b on a plurality of metallization levels (M1-Mn) that are surrounded by an insulating material, wherein the interconnect lines and vias are electrically connected to the contacts 4a and other structures of the first dielectric layer 4. The passivation dielectric layer 6 includes contact pads 7 which are electrically connected to the interconnect lines and vias of the second dielectric layer 5. The top surface of the passivation dielectric layer 6 is the front face of the wafer 1'. The bottom surface of the substrate 3 is the back face of the wafer 1'.

Through-Silicon Via or Through-Semiconductor Via (collectively "TSV") technology is further used to form an interconnection of conductive material that extends vertically through the integrated circuit chip so as to enable electrical connection of elements of the circuit, integrated at various levels of the structure of the integrated circuit chip, with an external face (front and/or back) of the integrated circuit. The TSV is developed vertically through the integrated circuit chip (for example, through the substrate 3' and other included layers of the wafer 1' in such a way that, at the end of the manufacturing process the TSV is accessible from the external face of the integrated circuit chip.

Figure 1:
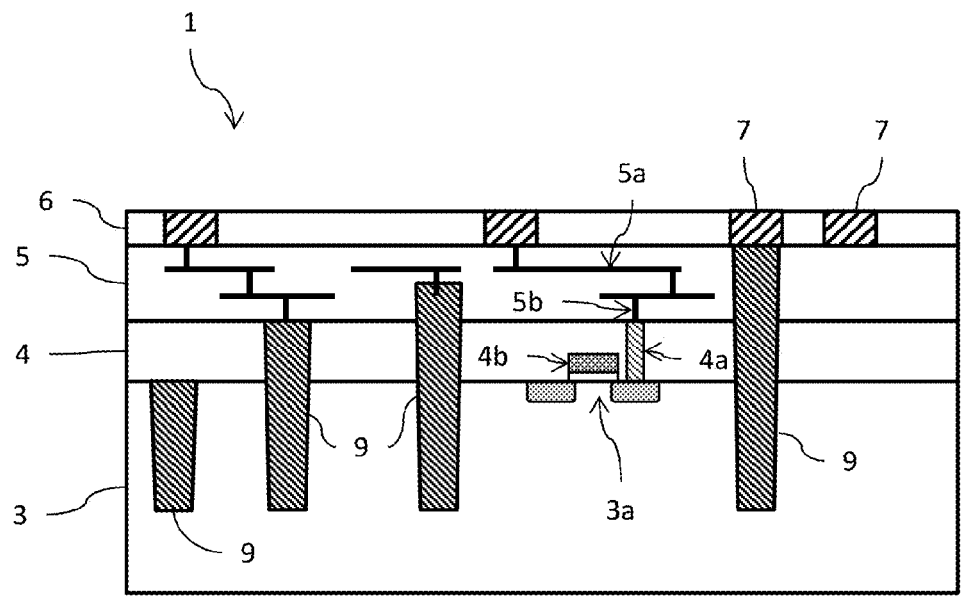
FIG. 1 is a schematic cross-section of a wafer of semiconductor material, in which through vias are provided, at an intermediate stage of a manufacturing process.

FIG. 5 shows a number of examples of the use of a TSV 9. Each TSV 9 forms a conductive interconnection that extends vertically through the substrate 3' and possibly traverses (fully or partially) one or more of the layers 4, 5 and 6. In particular, by way of example, FIG. 1 shows: a TSV 9 which extends through the first dielectric layer 4 and partially through the substrate 3' (for example, completely through layer 3p and partially through layer 3n); a TSV 9 that extends at least partially through the second dielectric layer 5, through the first dielectric layer 4 and partially through the substrate 3' (for example, completely through layer 3p and partially through layer 3n); and a TSV 9 that extends through the first and second dielectric layers 4 and 5 and partially through the substrate 3' (for example, completely through layer 3p and partially through layer 3n).

Figure 2:
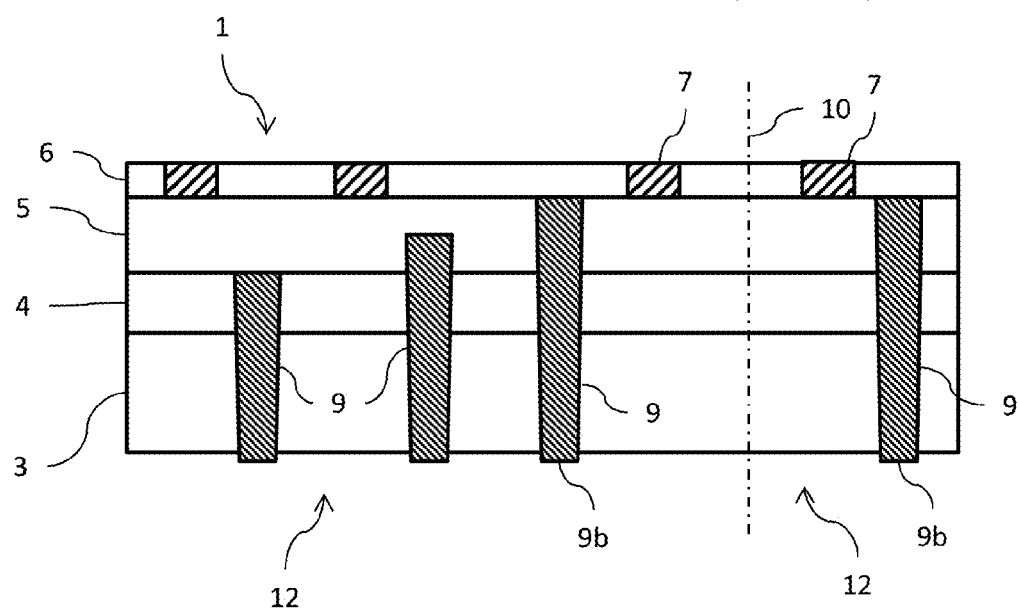
FIG. 2 is a schematic cross-section of the wafer of FIG. 1 at an end stage of the manufacturing process.

In the overall fabrication process, the substrate 3' with electronic components and the first dielectric layer 4 are provided through appropriate processes designated by the acronym FEOL (Front End of Line). The second dielectric layer 5 and passivation dielectric layer 6, however, are provided through appropriate processes designated by the acronym BEOL (Back End of Line). The illustration in FIG. 5 is at an intermediate stage of fabrication before subsequent substrate 3' thinning (compare to FIG. 2) and before the wafer 1' is diced into individual integrated circuit chips. Thus, after the BEOL, the manufacturing process may further include the substrate thinning and wafer dicing operations.

Figure 3:
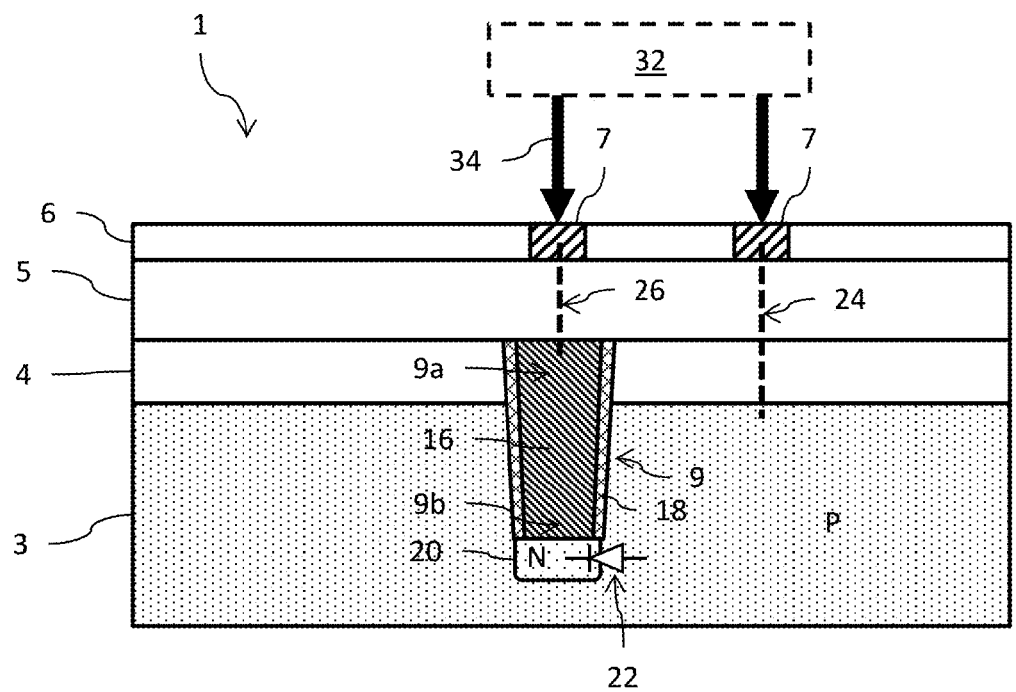
FIG. 3 illustrates a TSV testing structure and methodology as taught by U.S. Pat. No. 9,111,895.
Figure 4:
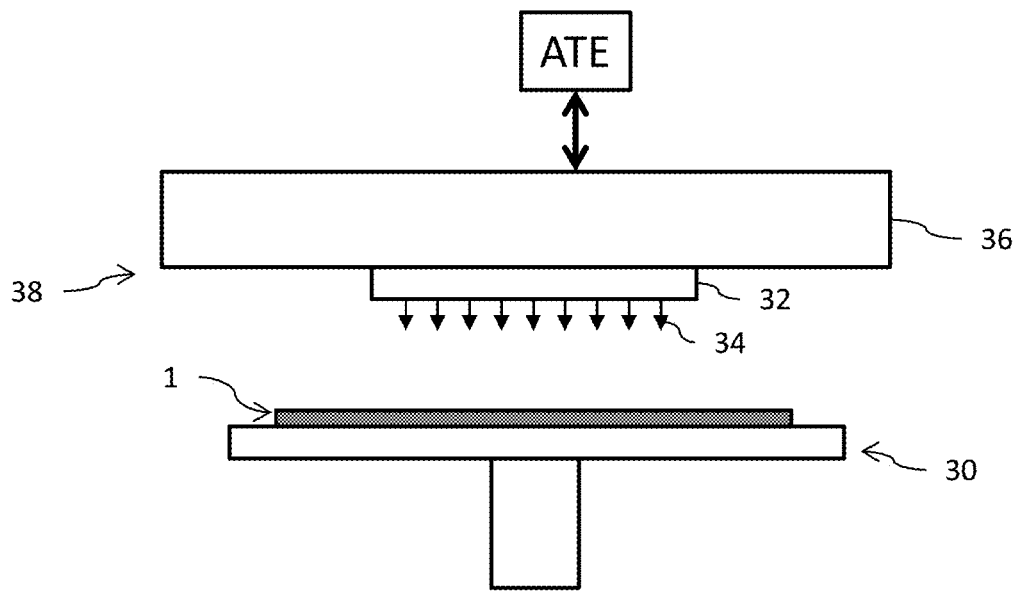
FIG. 4 is a schematic illustration of part of a testing apparatus for electrical testing of a wafer of semiconductor material.
Figure 6:
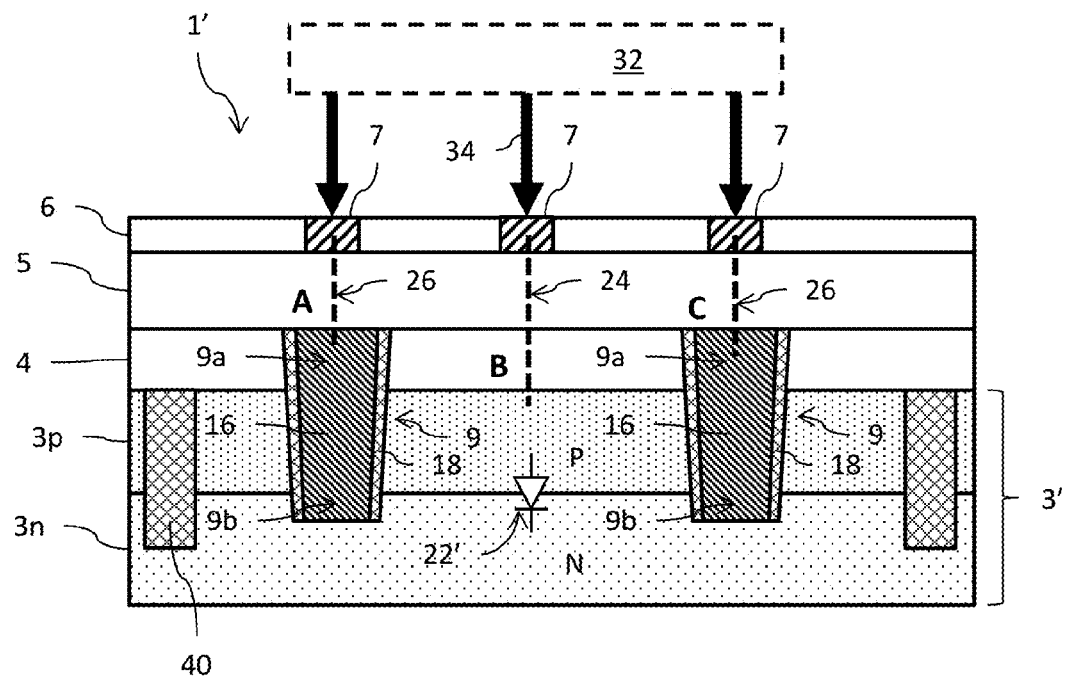
FIG. 6 illustrates an improved TSV testing structure and methodology using the wafer of FIG. 5.

Reference is now made to FIG. 6 which illustrates an improved TSV testing structure and methodology that can be used at the stage of manufacturing shown in FIG. 5. With reference to FIG. 6, each TSV 9 passes completely through the layer 3p of the substrate 3' and has its back end 9b embedded in the layer 3n of the substrate 3'. Each TSV 9 is formed by a conductive region 16 (for example, made of a metal material such as copper) surrounded laterally by an insulating/dielectric layer 18 (for example, made of an insulating material such as silicon oxide). In this configuration, distinct from the prior art implementation of FIG. 3, the conductive region 16 of the TSV 9 is in direct physical and electrical contact with the n-type doped semiconductor material of the substrate layer 3n. The layer 3p forms with layer 3n of the substrate 3' a PN semiconductor junction (i.e., a junction diode 22') having an anode terminal formed by the substrate layer 3p and a cathode terminal formed by the substrate layer 3n. Electrical connection to the anode terminal is made through an electrical contact 24 made to the substrate layer 3p while electrical connection to the cathode terminal is made through an electrical contact 26 made to the conductive region 16 of the TSV 9. The electrical contacts 24 and 26 may be implemented, for example, using electrically conductive structures (contacts, vias, lines) present within the layers 5 and 6 as well as the pads 7 in the layer 6.

Figure 7A:
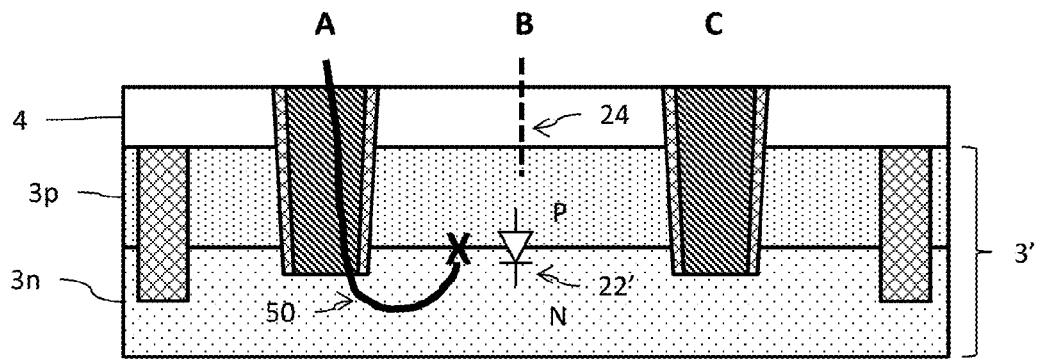
FIGS. 7A-7E illustrate testing scenarios using the improved TSV testing structure and methodology of FIG. 6.
Figure 7B:
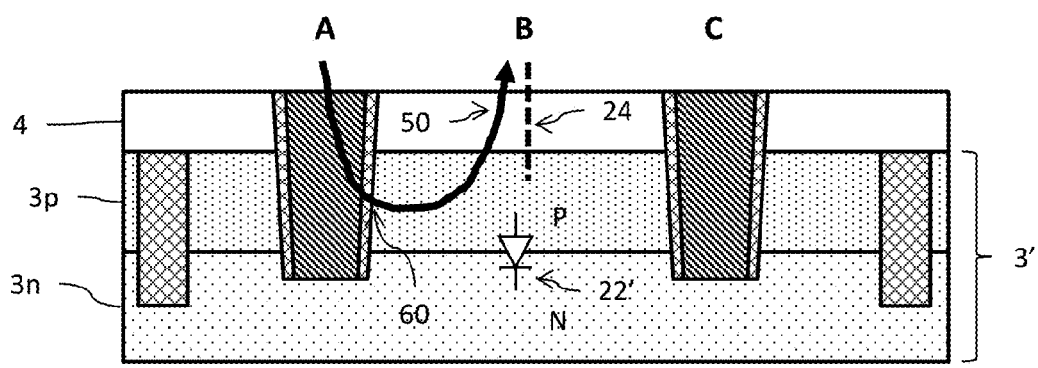
Figure 7C:
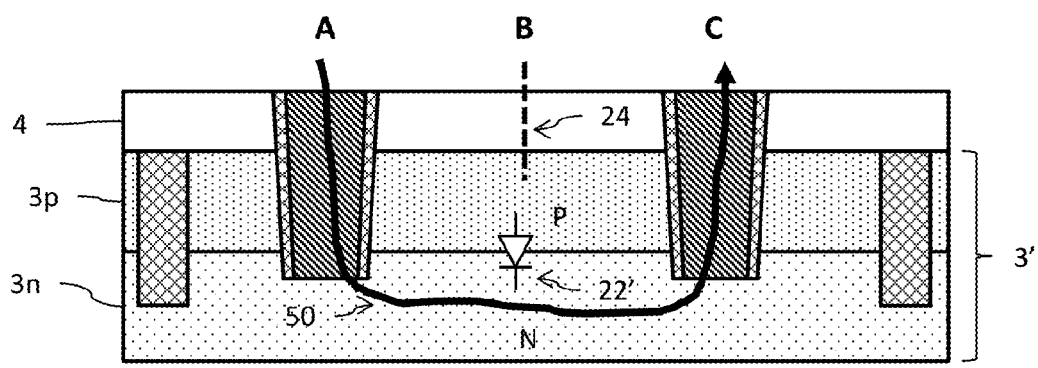
Figure 7D:
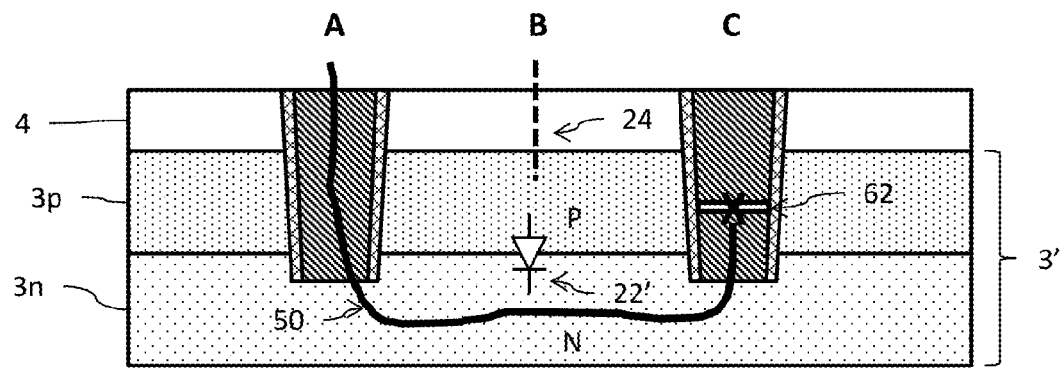
Figure 7E:
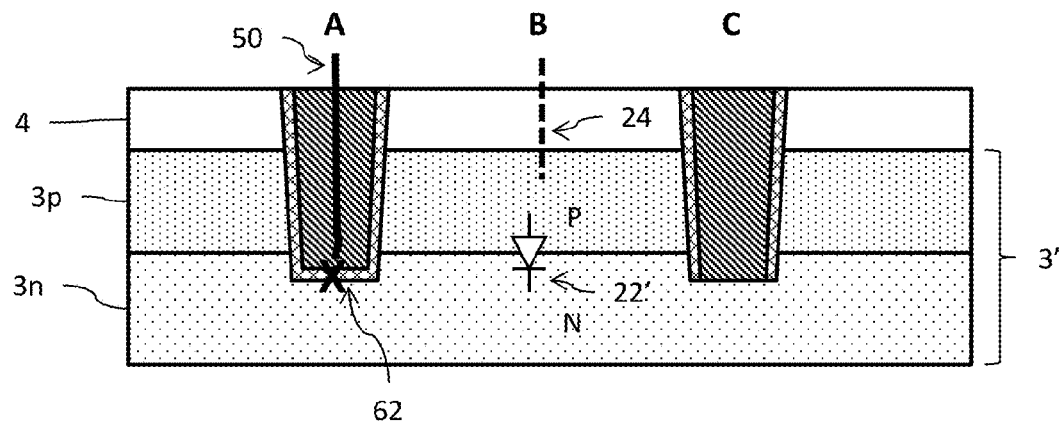

In use, the presence of the junction diode 22' formed by the PN junction of layer 3p/3n, accessible through the electrical contacts 24 and 26 and their associated pads 7 in the layer 6, enables the electrical testing of the included TSVs 9 to be carried out. In a test procedure using the testing apparatus of FIG. 3, for example, a current 50 is applied by the ATE and probe card 38 to node A at a selected one of the included TSVs 9 and first sensed at node B associated with the anode of the junction diode 22'. If no current is detected by the ATE at node B as shown in a simplified example with FIG. 7A (or if only a very small reverse bias leakage current is detected at node B), then it can be concluded that the TSV 9 at node B, as well as other TSVs electrically coupled to the substrate layer 3n, is properly laterally insulated from the substrate layer 3p by the insulating/dielectric layer 18. Conversely, if current 50 is detected at node B as shown in a simplified example with FIG. 7B, this indicates a failure (reference 60) of the lateral isolation (formed by insulating layer 18) of one or more of the TSVs electrically coupled to the substrate layer 3n. Then, sensing by the ATE is further performed at node C at another of the included TSVs 9. If the current 50 applied to node A is detected by the ATE at the node C as shown in a simplified example with FIG. 7C, then it can be concluded that the TSVs associated with nodes A and C are properly conducting current flow. Conversely, if the current 50 applied to node A is not detected by the ATE at node C, this indicates a fault (reference 62) due to a defect in the construction of at least one of the TSVs 9 (for example, due to interruption of the conductive region 16 of the TSV 9, as shown in a simplified example with FIG. 7D, or presence on an insulating film at the back end 9b of the TSV 9, as shown in a simplified example with FIG. 7E). Chips with fauty TSVs 9 can be identified and then discarded following the thinning of the substrate 3 and subsequent dicing operations.

In order to provide some control over which TSVs 9 are grouped together for testing, trench isolation structures 40 may be formed in the substrate 3'. The trench isolation structures 40 extend through the substrate layer 3p and eventually at least partially into the substrate layer 3n. The trench isolation structures 40 delimit a region of the substrate layer 3p and thus define a set of TSVs which are subject to a common testing. This set of TSVs may be a subset of the TSVs integrated in the chip 12, or all TSVs of the chip 12, or TSVs belonging to a plurality of chips 12 of the wafer. Alternatively, the trench isolation structures 40 may be omitted. In other embodiments, trench isolation structures may be provided for other reasons unrelated to the TSV testing disclosed herein.

The method of forming the TSVs 9 may, for example, comprise a masking of the substrate 3' followed by an anisotropic etch to forming an opening extending through the layer 3p and partially into the layer 3n. Then, the side wall and bottom of the opening is lined by an insulating layer (for example, using a conformal dielectric deposition or a thermal oxidation). An anisotropic etch is then performed to remove the insulating layer at the bottom of the opening. A barrier layer (for example, TiN) may be deposited in the opening and the opening is then subsequently filled with a conductive material, for example using a damascene and polishing operation or other known techniques.

This method for electrical testing of TSVs 9 can be applied to a 3D chip 12 as shown in FIG. 5 that comprises active integrated electronic components such as transistor devices 3a or it can be applied to a 2.5D chip 12 as shown in FIG. 6, also called interposer or silicon interposer, that does not include active integrated electronic components in layer 3p. Considering a 3D chip 12, this method for electrical testing of TSVs 9 can be applied using a BIST (Built-In Self Test) circuit embedded in the 3D chip 12 (for example using circuitry like the transistor devices 3a in layer 3p connected as needed to the TSVs and layer 3p) as shown in FIG. 5, or without any BIST circuit, using only the ATE that is linked or connected to the 3D chip 12 from the outside as shown in FIG. 6. With respect to considering a 2.5D chip 12, this testing method is applied by an ATE because active integrated electronic components are, in general, absent in the interposer.

Moreover, this method for electrical testing of TSVs 9, can be applied to any other through via in any semiconductor substrate, and thus it is not limited to silicon substrates.

The foregoing description has provided by way of exemplary and non-limiting examples providing a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An apparatus, comprising:
a semiconductor substrate including a first semiconductor layer of a first conductivity type and a second semiconductor layer of a second conductivity type opposite the first conductivity type, said first and second semiconductor layers in contact with each other at a PN junction to form a junction diode;
a first through silicon via structure comprising a conductive region surrounded laterally by an insulating layer, said first through silicon via structure extending completely through the first semiconductor layer and partially through the second semiconductor layer with a back end of the first through silicon via structure embedded in the second semiconductor layer with the conductive region in physical and electrical contact with the second semiconductor layer;
a first electrical connection made to a front end of the first through silicon via structure; and
a second electrical connection made to the first semiconductor layer.

2. The apparatus of claim 1, further comprising a testing circuit configured to:
generate a testing current applied to the first electrical connection to flow through the first through silicon via structure; and
sense said testing current at the second electrical connection in order to detect a fault in the first through silicon via structure.

3. The apparatus of claim 2, wherein said fault is a defect in the insulating layer laterally surrounding the conductive region of the first through silicon via structure.

4. The apparatus of claim 2, wherein the testing circuit is a Built-In Self Test (BIST) circuit supported by at least one of the first or second semiconductor layers.

5. The apparatus of claim 2, wherein the testing circuit is Automated Test Equipment (ATE) electrically coupled to the first and second electrical connections through a probe card.

6. The apparatus of claim 1, further comprising a testing circuit configured to:
generate a testing current applied to the first electrical connection to flow through the first through silicon via structure; and
sense an absence of said testing current at the second electrical connection in order to confirm correct operation of said first through silicon via structure.

7. The apparatus of claim 6, wherein the testing circuit is a Built-In Self Test (BIST) circuit supported by at least one of the first or second semiconductor layers.

8. The apparatus of claim 6, wherein the testing circuit is Automated Test Equipment (ATE) electrically coupled to the first and second electrical connections through a probe card.

9. The apparatus of claim 1, further comprising:
a second through silicon via structure comprising a conductive region surrounded laterally by an insulating layer, said second through silicon via structure extending completely through the first semiconductor layer and partially through the second semiconductor layer with a back end of the second through silicon via structure embedded in the second semiconductor layer with the conductive region in physical and electrical contact with the second semiconductor layer; and
a third electrical connection made to a front end of the second through silicon via structure.

10. The apparatus of claim 9, further comprising a testing circuit configured to:
generate a testing current applied to the first electrical connection to flow through the first through silicon via structure; and
sense an absence of said testing current at the third electrical connection in order to detect a fault in at least one of the first and second through silicon via structures.

11. The apparatus of claim 10, wherein said fault is a discontinuity of the conductive region of at least one of the first and second through silicon via structures.

12. The apparatus of claim 10, wherein said fault is an extension of the insulating layer laterally surrounding the conductive region to insulating said conductive region of at least one of the first and second through silicon via structures from the second semiconductor layer.

13. The apparatus of claim 10, wherein the testing circuit is a Built-In Self Test (BIST) circuit supported by at least one of the first or second semiconductor layers.

14. The apparatus of claim 10, wherein the testing circuit is Automated Test Equipment (ATE) electrically coupled to the first, second and third electrical connections through a probe card.

15. The apparatus of claim 9, further comprising a testing circuit configured to:
generate a testing current applied to the first electrical connection to flow through the first through silicon via structure; and
sense said testing current at the third electrical connection in order to confirm correct operation of said first and second through silicon via structures.

16. The apparatus of claim 15, wherein the testing circuit is a Built-In Self Test (BIST) circuit supported by at least one of the first or second semiconductor layers.

17. The apparatus of claim 15, wherein the testing circuit is Automated Test Equipment (ATE) electrically coupled to the first and second electrical connections through a probe card.

18. The apparatus of claim 9, further including a trench isolation structure extending through at least the first semiconductor layer to define a set of through silicon via structures including said first and second through silicon via structures which are subject to a common testing.

19. The apparatus of claim 1, forming an interposer structure that does not include active integrated circuit devices formed in either of the first or second semiconductor layers.

20. The apparatus of claim 1, further including a Built-In Self Test (BIST) circuit supported by at least one of the first or second semiconductor layers and electrically connected to the first and second electrical connections.

21. An apparatus, comprising:
a first semiconductor region of a first conductivity type;
a second semiconductor region of a second conductivity type opposite the first conductivity type, said first and second semiconductor regions in contact with each other at a PN junction to form a junction diode;
a first through silicon via structure comprising a conductor laterally surrounded by an insulating layer, said first through silicon via structure extending completely through the first semiconductor region to reach the second semiconductor layer with the conductor at a back end of the first through silicon via structure in physical and electrical contact with the second semiconductor region;
a first electrical connection made to the conductor at a front end of the first through silicon via structure; and
a second electrical connection made to the first semiconductor layer.

22. The apparatus of claim 21, further comprising a testing circuit configured to:
generate a testing current applied to the first electrical connection to flow through the first through silicon via structure; and
sense at the second electrical connection in order to detect an operating condition of the first through silicon via structure.

23. The apparatus of claim 22, wherein the operating condition is a fault of the first through silicon via structure.

24. The apparatus of claim 21, further comprising:
a second through silicon via structure comprising a conductor laterally by an insulating layer, said second through silicon via structure extending completely through the first semiconductor region to reach the second semiconductor layer with the conductor at a back end of the second through silicon via structure in physical and electrical contact with the second semiconductor region; and
a third electrical connection made to the conductor at a front end of the second through silicon via structure.

25. The apparatus of claim 24, further comprising a testing circuit configured to:
generate a testing current applied to the first electrical connection to flow through the first through silicon via structure; and
sense at the third electrical connection in order to detect an operating condition of at least one of the first and second through silicon via structures.

26. The apparatus of claim 25, wherein the operating condition is a fault of one of the first and second through silicon via structures.

* * * * *

UNITED STATES PATENT AND TRADEMARK OFFICE
CERTIFICATE OF CORRECTION

Page 1 of 1

PATENT NO. : 9,966,318 B1
APPLICATION NO. : 15/420319
DATED : May 8, 2018
INVENTOR(S) : Alberto Pagani It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 0 days.

Signed and Sealed this
Ninth Day of October, 2018

Andrei Iancu
*Director of the United States Patent and Trademark Office*